(12) United States Patent
Iwasa

(10) Patent No.: US 9,236,388 B2
(45) Date of Patent: *Jan. 12, 2016

(54) SEMI CONDUCTOR DEVICE HAVING ELEVATED SOURCE AND DRAIN

(71) Applicant: PS4 LUXCO S.A.R.L., Luxembourg (LU)

(72) Inventor: Shinya Iwasa, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/272,555

(22) Filed: May 8, 2014

(65) Prior Publication Data

US 2014/0239389 A1 Aug. 28, 2014

Related U.S. Application Data

(63) Continuation of application No. 13/117,864, filed on May 27, 2011, now Pat. No. 8,759,844.

(30) Foreign Application Priority Data

May 31, 2010 (JP) .................................. 2010-125111

(51) Int. Cl.
*H01L 27/108* (2006.01)
*H01L 29/66* (2006.01)

(52) U.S. Cl.
CPC .... *H01L 27/10897* (2013.01); *H01L 27/10873* (2013.01); *H01L 27/10894* (2013.01); *H01L 29/66628* (2013.01)

(58) Field of Classification Search
CPC ............ H01L 29/66628; H01L 29/665; H01L 29/7834; H01L 27/10894; H01L 27/10897
See application file for complete search history.

(56) References Cited

U.S. PATENT DOCUMENTS 8,759,844 B2 * 6/2014 Iwasa .............................. 257/83

* cited by examiner

*Primary Examiner* — John C Ingham

(57) ABSTRACT

Semiconductor layers on active areas for transistors in a memory cell region (region A) and a peripheral circuit region (region B) are simultaneously epitaxially grown in the same thickness in which the adjacent semiconductor layers in region A do not come into contact with each other. Only semiconductor layer (10) in region B is also grown from the surface of a substrate which is exposed when only the surface of STI (2) in region B is drawn back, so that a facet (F) of the semiconductor layer 10 is formed outside the active area, followed by ion-implantation to form a high density diffusion layer (11) in region B. Accordingly, short circuit between semiconductor layers on source/drain electrodes of transistors in region A is prevented, and uniformity of the junction depth of the layer (11) of the source/drain electrodes including an ESD region in a transistor of region B is obtained, thereby restricting the short channel effect.

2 Claims, 13 Drawing Sheets

SEMICONDUCTOR DEVICE HAVING ELEVATED SOURCE AND DRAIN

BACKGROUND OF THE INVENTION

1. Field of the Invention

This application is a Continuation application of U.S. application Ser. No. 13/117,864 filed May 27, 2011, which claims the benefit of priority of Japanese Patent Application No. 2010-125111, filed May 31, 2010, the disclosures of which are incorporated by reference in their entirety.

The present invention relates, in general, to a semiconductor device and, more particularly, to a semiconductor device such as a dynamic random access memory (DRAM) including a transistor having an elevated source/drain (ESD) structure in at least a peripheral circuit region.

2. Description of the Related Art

In a semiconductor device, two or more transistors with different characteristics are often mounted on a single substrate.

For example, a semiconductor device such as a DRAM includes, on a semiconductor substrate, a cell transistor connected to a memory device such as a capacitor, a transistor of an array circuit such as X and Y decoders for control of a memory cell, a transistor of a peripheral circuit for control of data I/O or an array circuit. Generally, from the viewpoint of providing a prescribed area of a memory cell region with cells as many as possible, transistors are closely packed rather than those of the array circuit and peripheral circuit.

Conventionally, it is general that the transistors of the array circuit and peripheral circuit (hereinafter such a transistor is referred to as a 'peripheral circuit transistor', and the region where the 'peripheral circuit transistors' are mounted is referred to as a 'peripheral circuit region'), which are required to operate at high speed, form a high density impurity diffusion layer so as to make source/drain have low resistance. In case of forming high density impurity diffusion layer, a problem of short channel effect is caused due to diffusion of impurities towards a channel. To solve this problem, it is proposed that an LDD structure or an extension region is provided. With advance of generation in development of a semiconductor device, there is a need that source/drain region has to be made shallower from the surface of a substrate than currently available depth.

Thus, a structure is proposed that an epitaxially growth silicon layer is formed on a source/drain region to elevate the source/drain region from an original position of a substrate surface, thereby both making the junction depth from the substrate surface shallower and securing practical junction depth of the source/drain region. Such a structure is called an elevated source/drain structure (ESD structure) (see JP 03-049259A).

Meanwhile, since transistors in the memory cell region are formed much finer and denser than transistors in the peripheral circuit region, a gate length and also a gate distance become shorter, so that there is a need to make a junction shallower for restricting the short channel effect and ensuring low leak current.

There is a tendency that as the cell size decreases, a contact size and junction depth decrease, so that it is difficult to secure an electrical characteristic of a device, particularly to make the contact resistance lower. To solve this problem, JP 2003-338542A proposed a landing plug structure in which a single crystal silicon layer is epitaxially grown on a semiconductor substrate, and a polysilicon plug is formed thereon. The epitaxially growth silicon layer is also called a landing pad. With the formation of the landing pad, the contact resistance occurring due to natural oxide on the substrate surface is restricted from increasing.

Further, JP 2008-130756A discloses a semiconductor device such as a DRAM, in which a first epitaxial semiconductor layer on source/drain of a MOS transistor in a memory cell region, and a second epitaxial semiconductor layer on source/drain of a MOS transistor in a peripheral circuit region are formed.

However, in terms of process-simplification in the manufacture of the DRAM, it is generally carried out that the cell transistor and the peripheral circuit transistor are manufactured in common. When attempting to form transistors in the memory cell region and the peripheral circuit region using a common process, as described in JP 2008-130756A, before a high density impurity diffusion layer is formed in a peripheral circuit region, i.e. before an interlayer insulating film is formed on a semiconductor substrate, a semiconductor layer that serves as elevated source/drain in the peripheral circuit region and also serves as a landing pad in the memory cell region is formed.

Here, the ESD structure formed in the peripheral circuit region will be described with reference to FIGS. 8-10. Meanwhile, the figures are drawn by the inventors for explanation of a problem to be solved, so they are not the related art itself.

As shown in FIG. 8, shallow trench isolation (STI) 2 is formed in semiconductor substrate 1 to define an active area. Conductive material 4 and cap layer 5 are formed in the active area with gate insulating layer 3 interposed therebetween, and are patterned to form gate electrode 6. Next, sidewall spacer 8 formed of an insulating material is formed on a sidewall of the gate electrode, and impurity ions having reverse conductive type of semiconductor substrate 1, e.g. if semiconductor substrate 1 is p-type silicon, low concentration n-type impurity ions, are doped using the sidewall spacer 8 as a mask, to form LDD layer (low density impurity diffusion layer) 7. Semiconductor layer 10 is formed on LDD layer 7 by means of selective epitaxial growth.

In the selective epitaxial growth, it is known that since an outer side (end) of the formed semiconductor layer is surrounded by STI 2 formed from silicon oxide layer, the epitaxial silicon layer is restricted from being grown in a lateral direction, forming a tapered profile called a facet.

FIG. 9 shows the portion indicated by "A" of FIG. 8 in a magnified scale. In FIG. 9, "F" denotes the facet. Impurities are ion-implanted into semiconductor substrate 1 through semiconductor layer 10, thereby forming high density impurity diffusion layer 11. Semiconductor layer 10 with impurities ion-implanted becomes elevated source/drain region 10'. Here, in the outside of the active area (near STI 2), the depth of high density impurity diffusion layer 11 from the surface of semiconductor substrate 1 becomes deeper than the depth in the other region, thereby form deep impurity region 11d, due to the effect of facet F. FIG. 10 shows the ESD structure after the formation of high density impurity diffusion layer 11.

FIG. 11 shows a plan view of a transistor, wherein an active area comparted by STI 2 is indicated by "K". High density impurity diffusion layer 11 is formed at deep impurity region 11d along the outer end of active area K. Thus, in region B adjacent to gate electrode 6, the source/drain electrode is formed by deep impurity region 11d, so that the short channel effect is ready to occur, making it difficult to obtain prescribed electric characteristics.

Meanwhile, in order to reduce the effect by the facet, it is considered that the epitaxially growth silicon layer is made thicker so as to make shallower the implantation depth in the semiconductor substrate. Further, since the facet is created at a contact surface between the epitaxially growth silicon layer and the silicon oxide layer to restrict the epitaxially growth silicon layer from being grown, there was a proposal to form the surface of the STI with a silicon nitride layer that does not restrict the epitaxially growth silicon layer from being grown, thereby preventing the formation of the facet. However, when attempting to form the epitaxially growth silicon layer on the source/drain electrode of the cell transistor using the same process, adjacent epitaxially growth silicon layers may contact each other to cause a short because the width of the STI separating the adjacent cell transistors from each other is narrower than the peripheral circuit region. This is because the epitaxial growth is carried out in a lateral direction. For example, this is because as the epitaxially growth silicon layer is made thicker, lateral projection also increases, and in addition, because in case that the silicon nitride layer hardly causing a facet is formed on the surface of the STI, lateral growth occurs in the same degree as the thickness of the epitaxially growth layer.

SUMMARY

The present inventor discovered that in a semiconductor device having a memory cell region and a peripheral circuit region, only the surface of a shallow trench isolation (STI) in the peripheral circuit region is drawn back from the surface of a semiconductor substrate, and a semiconductor layer serving as elevated source/drain is also grown from the side of the exposed substrate, thereby preventing contact and a short-circuit between semiconductor layers formed in the memory cell region by the same process, securing uniformity of the junction depth of a high density impurity diffusion layer of a transistor in the peripheral circuit region, and restricting the short channel effect.

That is, in an aspect of the present invention, there is provided a semiconductor device including a memory cell region having a memory device and a cell transistor electrically connected to the memory device, and a peripheral circuit region in which a peripheral circuit transistor is formed, wherein the cell transistor includes, in an active area of a semiconductor substrate zoned by a shallow trench isolation (STI), a gate electrode, source/drain regions formed in the active areas on both sides of the gate electrode, and a selectively epitaxially growth semiconductor layer formed on the source/drain regions, wherein the peripheral circuit transistor includes, in an active area of a semiconductor substrate zoned by a STI, a gate electrode, source/drain regions of an LDD structure including a high density impurity diffusion layer formed in the active areas on both sides of the gate electrode, and elevated source/drain regions formed from a selectively epitaxially growth semiconductor layer formed on the source/drain regions, wherein the selectively epitaxially growth semiconductor layers of the cell transistor and the peripheral circuit transistor have a substantially same thickness such that the semiconductor layers provided on the active areas of the adjacent cell transistors opposite to each other do not contact each other, wherein only the surface of the STI in the peripheral circuit region is drawn back from the surface of the semiconductor substrate, and the selectively epitaxially growth semiconductor layer of the peripheral circuit transistor includes a semiconductor layer also epitaxially grown from the side of the semiconductor substrate exposed by the surface of the STI being drawn back so as to position a facet of the semiconductor layer outside the active area, and wherein in the peripheral circuit transistor, the bottom of the high density impurity diffusion layer is located at substantially equal depth in the semiconductor substrate from the center to periphery of the active area.

In another aspect of the present invention, there is provided a semiconductor device comprising:

a cell transistor provided in a memory cell region, a peripheral circuit transistor provided in a peripheral circuit region, and an shallow trench isolation (STI) defining each active area of the cell transistor and the peripheral circuit transistor in a semiconductor substrate;

wherein the cell transistor comprises a first impurity diffusion layer, a gate electrode and a gate sidewall spacer;

wherein the peripheral circuit transistor comprises a first impurity diffusion layer, a second impurity diffusion layer, a gate electrode and a gate sidewall spacer;

wherein the second impurity diffusion layer is higher in the impurity density than the first impurity diffusion layer;

wherein a selectively epitaxially growth semiconductor layer is provided on each diffusion layer of the cell transistor and peripheral circuit transistor;

wherein the STI defining the active area of the peripheral circuit transistor is only drawn back from the surface of the semiconductor substrate so that the side surface of the semiconductor substrate is exposed;

wherein the selectively epitaxially growth semiconductor layer of the peripheral circuit transistor is also grown from the exposed side surface of the semiconductor substrate; and wherein the cell transistor further comprises a first contact plug electrically connecting between the selectively epitaxially growth semiconductor layer and a bit line on the first impurity diffusion layer.

According to an embodiment of the present invention, a phenomenon of which the junction depth of an elevated source/drain region of a peripheral circuit transistor is deeper in the end portion of the active area can be prevented by which a semiconductor layer is epitaxially grown also from the substrate surface exposed when only the STI in the peripheral circuit region is drawn back. Particularly, when the epitaxially growth semiconductor layer is also formed in the memory cell region, a short circuit through the semiconductor layers formed between adjacent memory cells is also restricted. Thus, the occurrence of short channel effect of the transistor disposed in the peripheral circuit region is restricted, thereby easily forming the semiconductor device having specified characteristics.

BRIEF DESCRIPTION OF THE DRAWINGS

The above features and advantages of the present invention will be more apparent from the following description of certain preferred embodiments taken in conjunction with the accompanying drawings, in which:

FIGS. 8-11 are cross-sectional views explaining a problem to be solved in a conventional semiconductor device, wherein FIG. 9 is an enlarged cross-sectional view showing a portion of the problem.

DETAILED DESCRIPTION OF THE PREFERRED EMBODIMENTS

Figure 1:
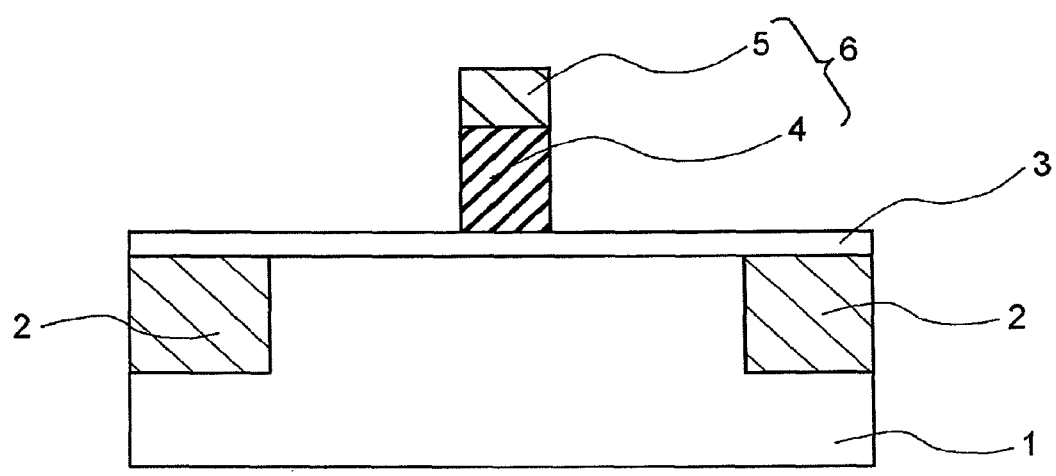
FIGS. 1-4 and 6-7 are cross-sectional views showing a procedure of manufacturing a transistor in a peripheral circuit region of a semiconductor device of the present invention.
Figure 2:
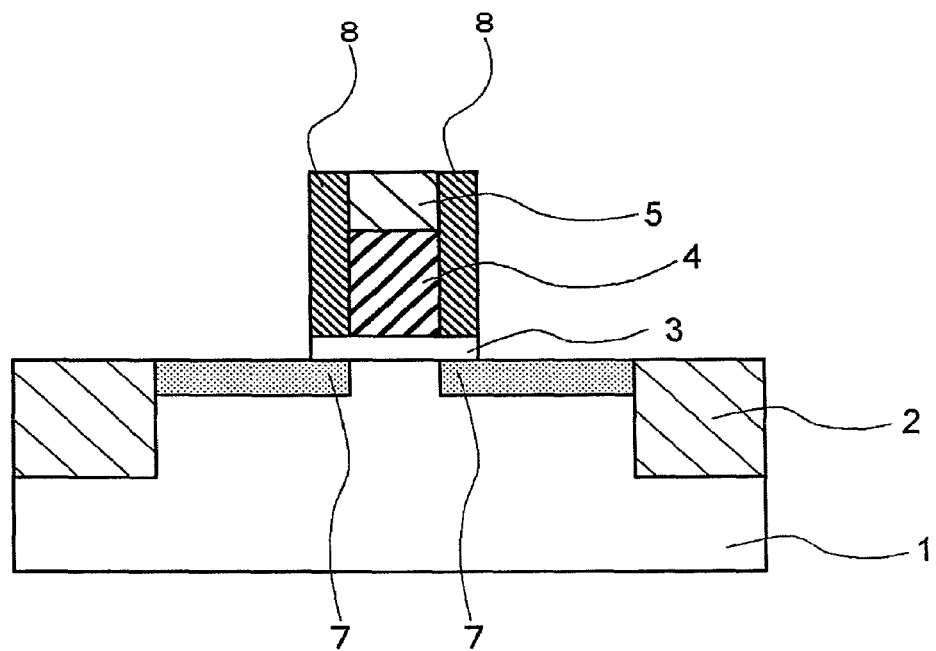
Figure 3:
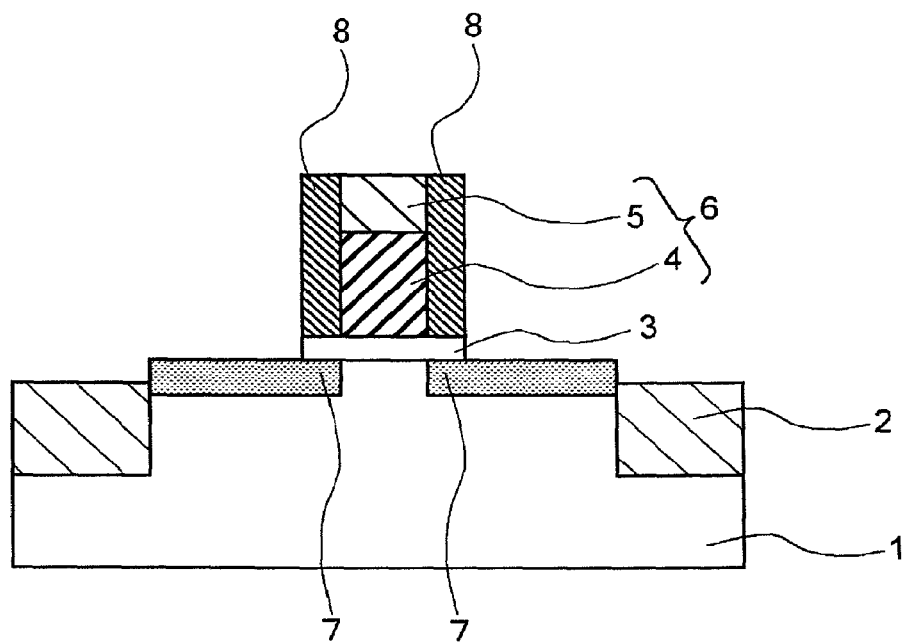
Figure 4:
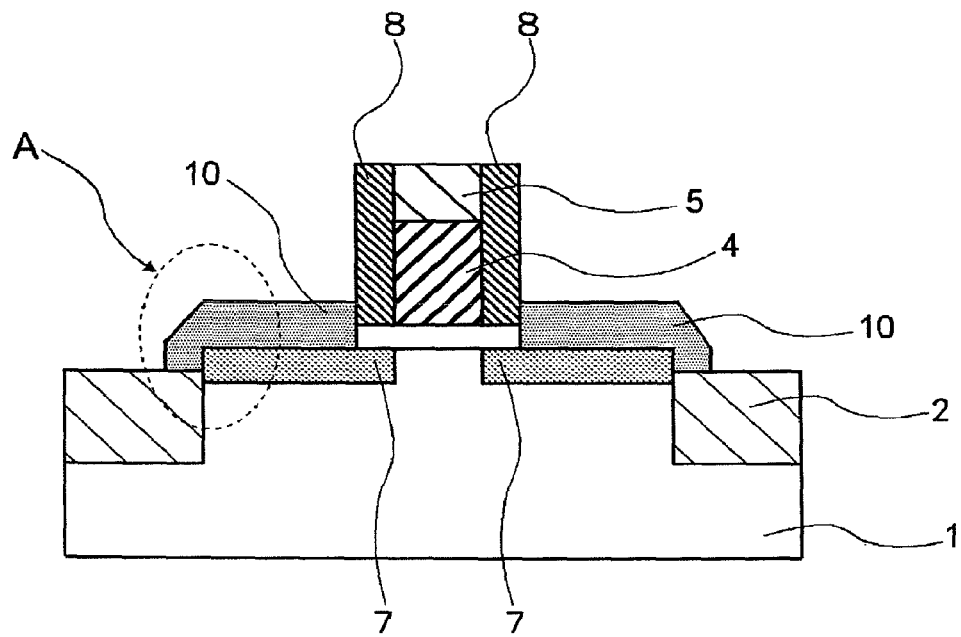

The invention will be now described herein with reference to illustrative embodiments. Those skilled in the art will recognize that many alternative embodiments can be accomplished using the teachings of the present invention and that the invention is not limited to the embodiments illustrated for explanatory purpose.

A description will now be made of the case of forming an N-channel type MOS transistor as an ESD structure peripheral circuit transistor formed in a peripheral circuit region, with reference to the drawings.

(FIG. 1)

Shallow trench isolation (STI) 2 in which a silicon oxide layer is embedded is formed in semiconductor substrate 1 by means of a conventional STI formation method or the like, thereby defining active areas. Gate insulating layer 3 is formed on semiconductor substrate 1, and a stacked body comprising gate conductive material 4 and cap layer 5 is patterned to form a gate electrode. As gate conductive material 4, a layer of which a metal such as tungsten is stacked on polysilicon containing impurities can be used. Cap layer 5 can be formed from a silicon nitride ($Si_3N_4$) layer.

(FIG. 2)

Sidewall spacer 8 is formed using an insulating film such as a silicon nitride film. Next, N-type impurities such as phosphorus (P) are ion-implanted with a dose of, for example, $1\times10^{13}$ to $1\times10^{14}$ atoms/cm$^2$ to form a first impurity diffusion layer (LDD layer 7). Meanwhile, LDD layer 7 can be formed by ion-implantation using gate electrode 6 as a mask before sidewall spacer 8 is formed, or otherwise LDD layer 7 can be formed using a thin first sidewall spacer as a mask and then a second sidewall spacer is formed on the first sidewall spacer. Meanwhile, if the surface of sidewall spacer 8 is formed with silicon oxide, an epitaxial growth of a silicon layer to be formed in a subsequent process is restricted at a contact surface with the silicon oxide, so that a facet is also created on a sidewall of the gate electrode (see e.g. JP 2000-49348A). Thus, it is preferred that the surface of sidewall spacer 8 be formed with an insulating material that does not restrict the selective epitaxial growth, particularly an insulating material containing nitrogen such as silicon nitride and silicon oxide nitride.

(FIG. 3)

Etching of silicon oxide is performed such that the level of an upper surface of STI 2 is becomes lower than the surface of semiconductor substrate 1. The drawn-back amount from the surface of the semiconductor substrate is necessarily and sufficiently controlled such that facet F of silicon layer 10 to be formed in a subsequent process is formed outside an active area. The drawn-back amount is preferably 10 nm or more from the surface of the semiconductor substrate. The upper limit of the drawn-back amount have a range that does not affect a function of the STI, but up to about 30 nm can suffice for that purpose. The etching of the silicon oxide can be performed by both dry etching and wet etching. Meanwhile, the illustrative embodiment shows that the side of gate insulating layer 3 below sidewall spacer 8 is exposed to the outside, and in this case, when wet etching is performed, etching time is controlled such that gate insulating layer 3 below the gate electrode is not excessively side-etched. In case that the side of gate insulating layer 3 is covered with sidewall spacer 8 such as silicon nitride layer, there is no need to precisely perform the time control. In addition when a thin liner film is formed on STI 2 using silicon nitride and silicon oxide is embedded thereon, the liner film contacting the active area of the peripheral circuit region may preferably be drawn back before embedding the silicon oxide.

(FIG. 4)

A silicon layer as a semiconductor layer is formed on semiconductor substrate 1 by means of selective epitaxial growth. The thickness of the semiconductor layer means the thickness that prevents semiconductors 10 in the memory cell region from coming into contact with each other. The thickness may have a range enough to form an elevated source/drain region, and the range may amount to, but not limited to, 20 to 40 nm.

Figure 5:
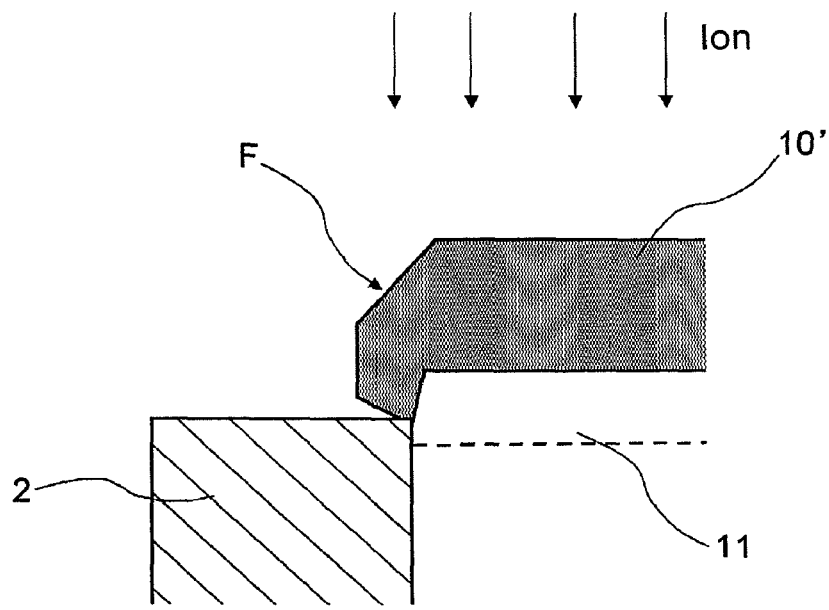
FIG. 5 is an enlarged cross-sectional view showing the state of semiconductor layer 10 of the transistor in the peripheral circuit region of the semiconductor device of the present invention.
Figure 6:
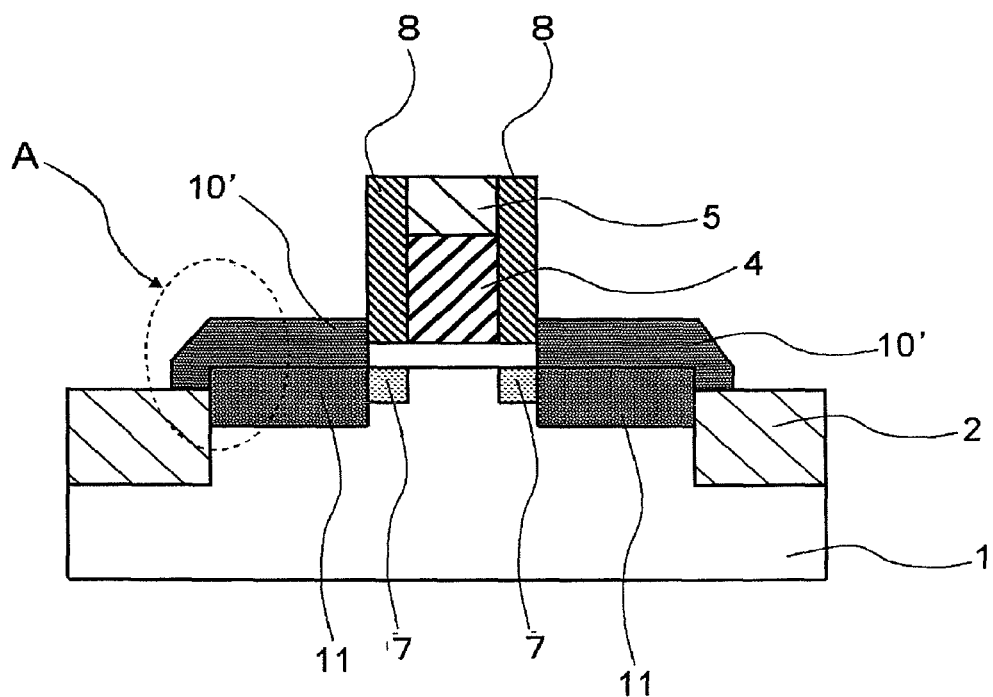
Figure 7:
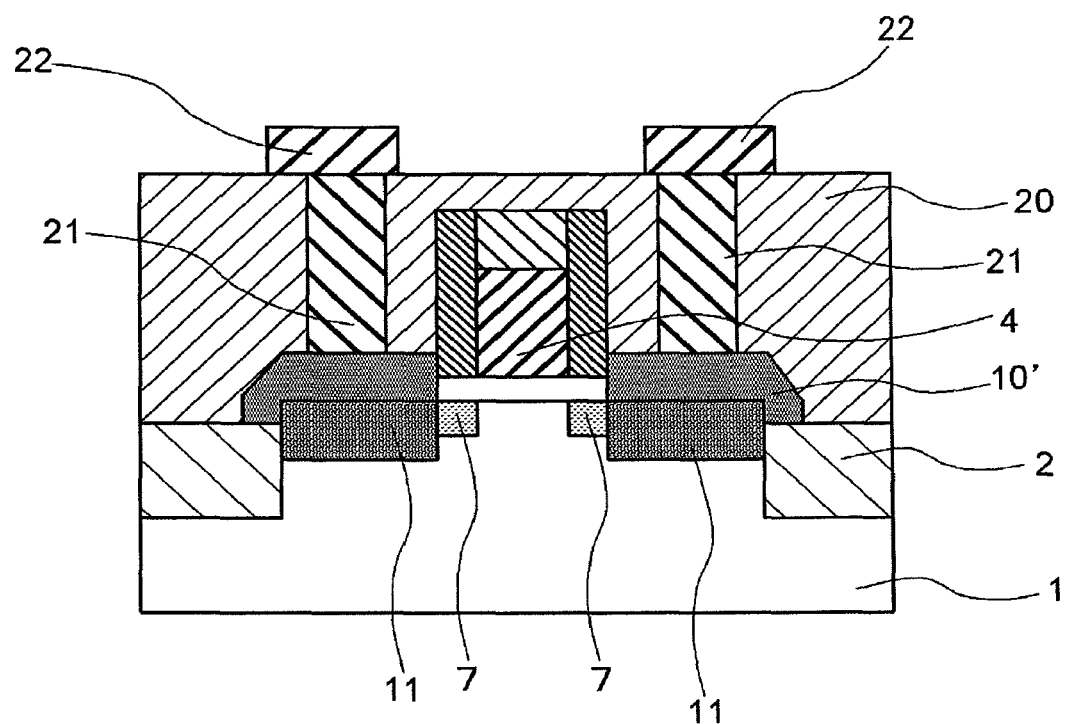
Figure 8:
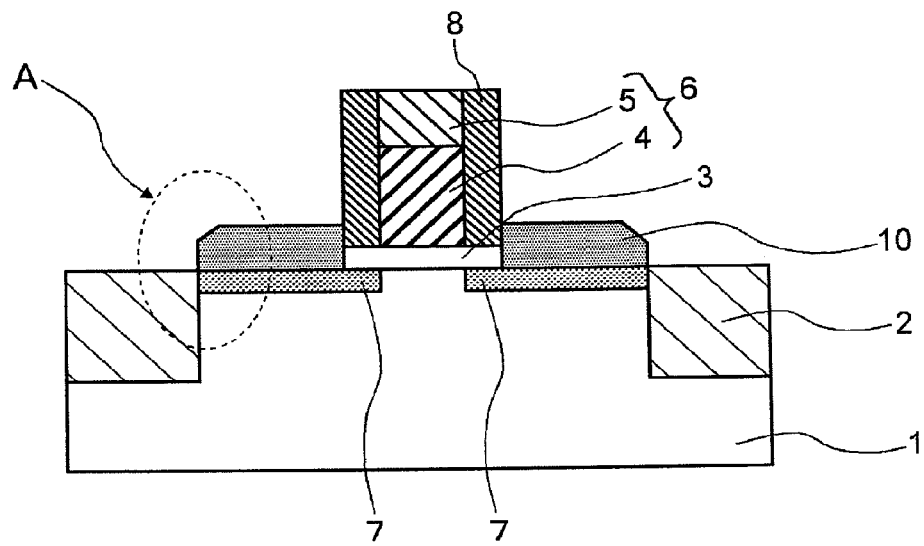
Figure 9:
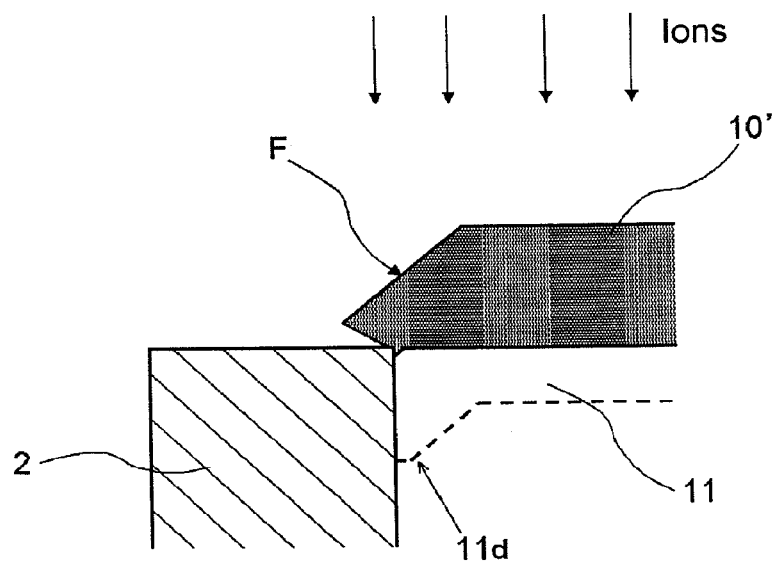
Figure 10:
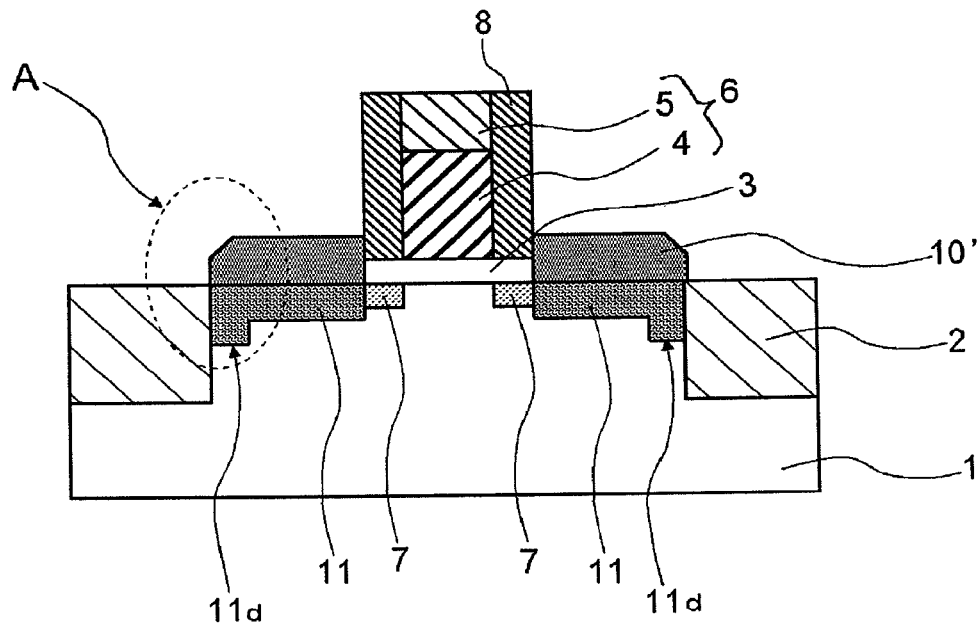
Figure 11:
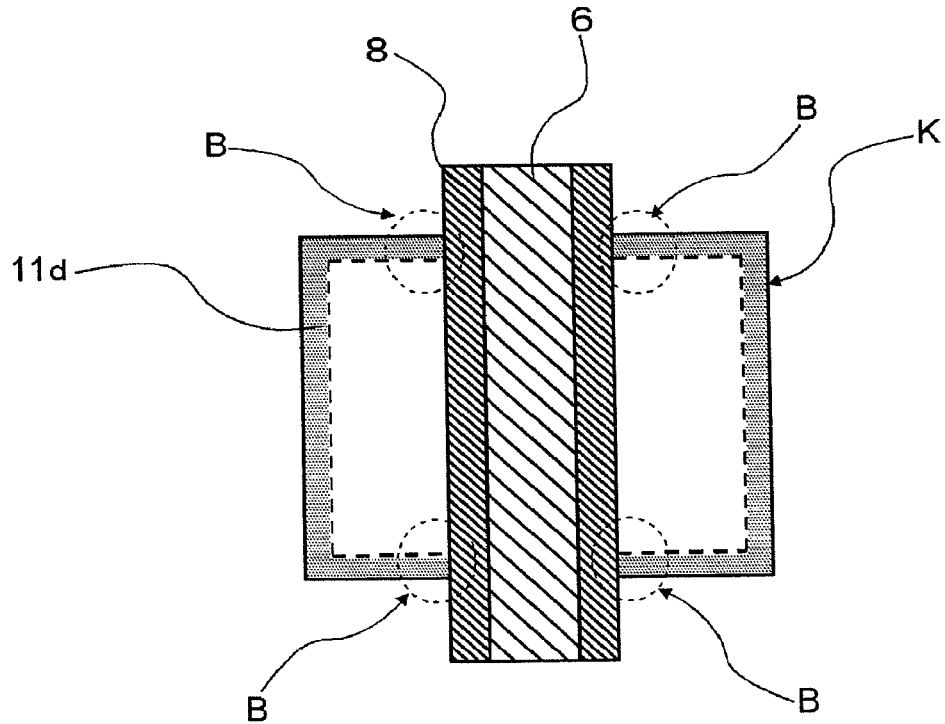

FIG. 5 shows the end portion A of the active area after the formation of semiconductor layer 10 in a magnified scale. In the present invention, at the time when semiconductor layer 10 is not formed, in the end portion of the active area, the sidewall (silicon face) of semiconductor substrate 1 that was brought into contact with STI 2 is partially exposed to the outside. Thus, semiconductor layer 10 is also grown in a lateral direction from the sidewall while being grown upwards. As a result, as shown in FIG. 5, the position of facet F moves laterally from the conventional position shown in FIG. 9, so that the facet is formed outside the active area K, i.e. on the STI 2.

In this state, when ion implantation is performed to form the source/drain electrode, the bottom (junction depth) of second impurity diffusion layer (high density impurity diffusion layer) 11 with an LDD structure is positioned substantially parallel with the upper surface of semiconductor substrate 1 in the active area. That is, unlike the related art, high density impurity diffusion layer 11 is not formed at a deep region 11d. Here, semiconductor layer 10 becomes elevated source/drain region 10' through ion implantation.

(FIG. 6)

It shows a cross-sectional view after the formation of high density impurity diffusion layer 11. In the formation of high density impurity diffusion layer 11, N-type impurities such as arsenic are ion-implanted with a dose of e.g. $5\times10^{14}$ to $5\times10^{15}$ atoms/cm$^2$.

(FIG. 7)

First interlayer insulating film 20 is formed using a silicon oxide layer or the like. First contact plug 21 and first interconnect 22 are formed such that they are connected to the source/drain electrode. As not shown in the drawing, a contact plug and interconnect are similarly formed such that they are connected to conductive layer 4 for the gate electrode.

Next, the memory cell region will be described. In the present embodiment, the memory cell region is arranged such that like a planar structure shown in FIG. 12, the plurality of thin, elongate rectangular active areas K are separately aligned diagonally right down at certain intervals. First impurity diffusion layers (LDD layers) are respectively provided on opposite ends and in the central portion of the respective active area K, and in this configuration, a source region is formed in the central portion of the respective active area K, and drain regions are formed on opposite ends of the active area. Substrate contacts 205c, 205a, and 205b are formed directly on the source and drain regions. In the present embodiment, an example is shown in which the present invention is adapted to the cell structure in which a 2-bit cell transistor is arranged in a single active area K.

Figure 12:
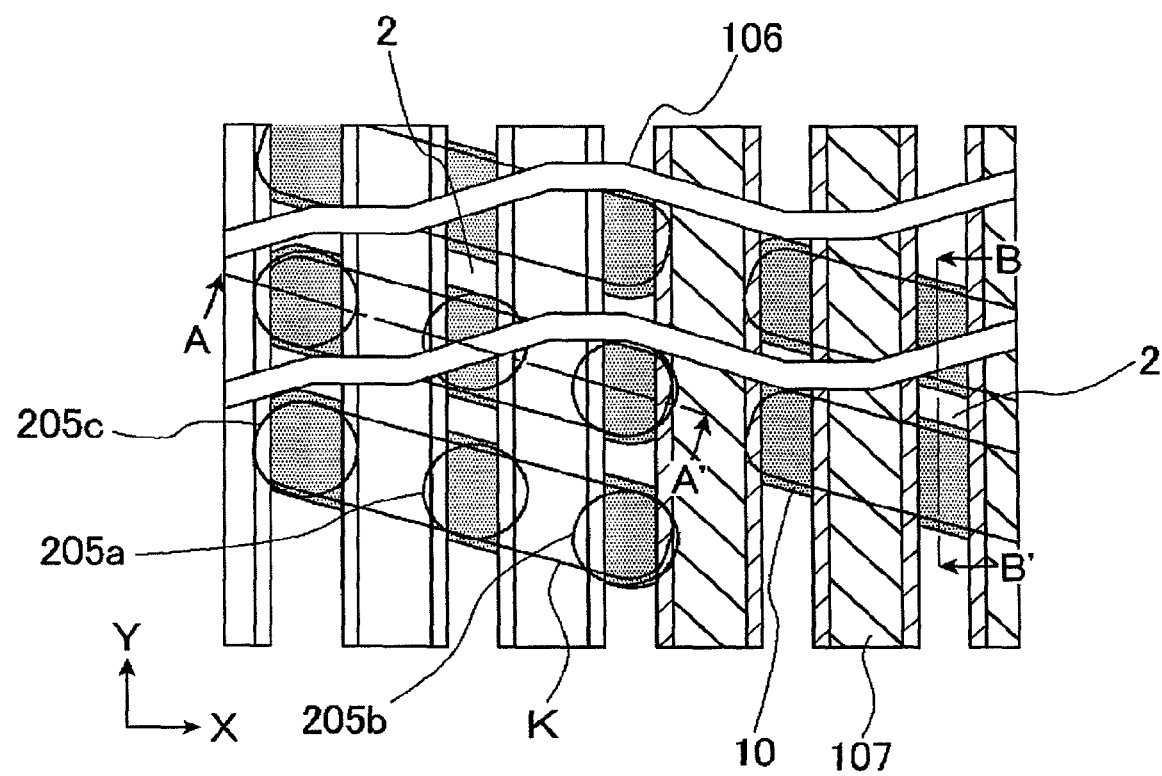
FIG. 12 is a plan view schematically showing a memory cell region of the semiconductor device of the present invention.

Meanwhile, the provision of active area K of the planar structure like the structure shown in FIG. 12 is a specific feature of the present embodiment, but the shape and direction of active area K is not essentially predetermined. The shape of active area K shown in FIG. 12 may of course have other shapes which can be adapted to other conventional transistors, so the present invention is not limited thereto.

A plurality of bit lines 106 are arranged such that they extend in a bent pattern in a lateral direction (X-direction) of FIG. 12 so that they are spaced at certain intervals in a longitudinal direction (Y-direction) of FIG. 12. Further, a plurality of linear word lines 107 are arranged such that they extend in the Y-direction so that they are spaced at certain intervals in the X-direction. The word lines 107 become the gate electrodes at the intersection with the respective active areas K, thereby forming a cell transistor.

Figure 13:
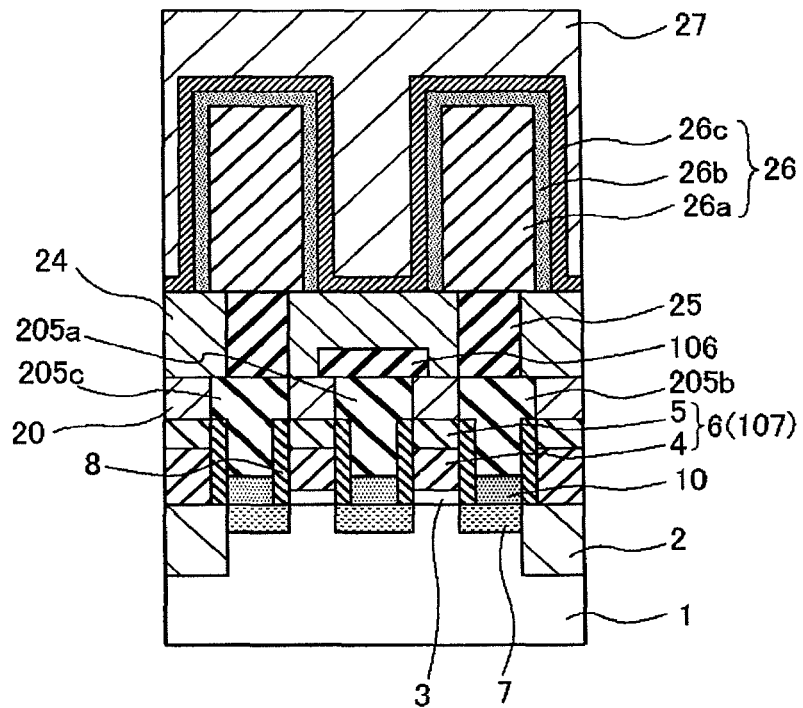
FIG. 13 is a schematic cross-sectional view taken along line A-A' of FIG. 12.

FIG. 13 is a cross-sectional view taken along line A-A' of FIG. 12, wherein in semiconductor substrate 1, LDD layers 7 serving as the source and drain electrodes are separately formed in active area K defined by STI 2, and on semiconductor substrate 1 between the source and drain, gate electrode 6, which is a staked body of gate conductive layer 4 and cap layer 5 via gate insulating layer 3, is formed. Gate conductive layer 4 and cap layer 5 are similarly formed to those of the MOS transistor in the peripheral circuit region. Meanwhile, the cell transistor generally uses a transistor having shorter gate length compared to the peripheral circuit transistor. In addition, the cell transistor in the memory cell region is not limited to the planar type transistor, but may be a recess gate type transistor which is further suitable for miniaturization. Thus, the effective gate length with respect to the width of the gate electrode can be extended.

Further, sidewall spacers 8 formed from the silicon nitride layer are formed on the sidewalls of gate electrode 6. On LDD layer 7, selectively epitaxially growth semiconductor layer 10 is formed.

First interlayer insulating film 20 is formed using a silicon oxide layer or the like. Substrate contact plugs 205a to 205c are formed such that they are connected to the source/drain electrode by means of a self-align contact (SAC) method. Substrate contact plugs 205a to 205c are formed with a conductive material such as polysilicon. Here, impurities having the same conductive type as LDD layer 7 may be introduced thereto. Thus, the contact resistance of the substrate contact plug can be reduced. In addition, when the impurities having the same conductive type as LDD layer 7 are introduced, the impurities are solid-diffused into silicon layer 10, so that the transistor in the memory cell region also becomes the elevated source/drain structure.

Bit line 106 is electrically connected to the source electrode through substrate contact plug 205a, and second contact plugs 25 as a capacitive contact plug are formed in the second interlayer insulating film 24 covering the bit line in order to electrically connect capacitor 26 to the respective drain electrode through substrate contact plug 205b and 205c.

On second contact plug 25, capacitor 26 comprises a pedestal type lower electrode 26a, capacitive dielectric layer 26b, and upper electrode 26c is formed as a memory device, and on capacitor 26, third interlayer insulating film 27 is formed, and a contact and an interconnect (not shown) are formed thereon such that they are connected to upper electrode 26c of the capacitor.

The present embodiment illustrated the capacitor having the pedestal type lower electrode, the invention is not limited thereto, but may adapt a known structure such as a capacitor that uses an inner wall or both inner and outer walls of a cylinder type electrode to increase capacity. Further, the memory device may use a memory device other than the capacitive device such as a capacitor.

Figure 14:
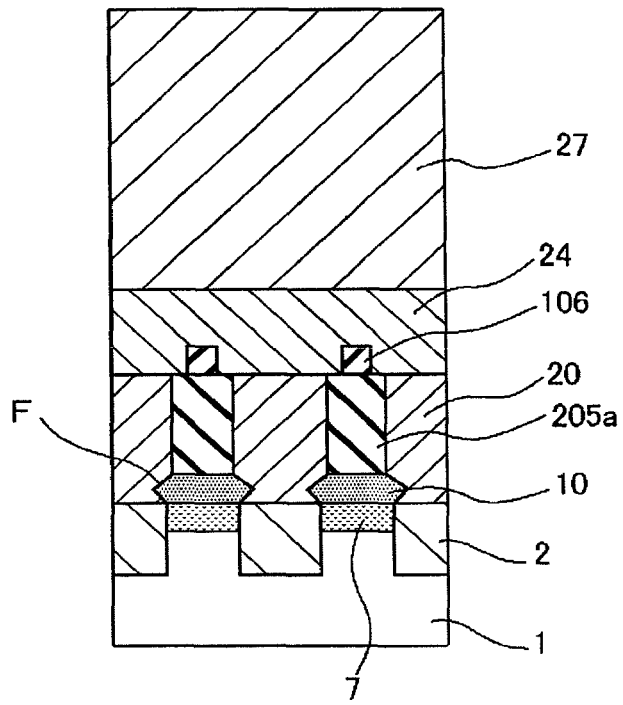
FIG. 14 is a schematic cross-sectional view taken along line B-B' of FIG. 12.
Figure 15:
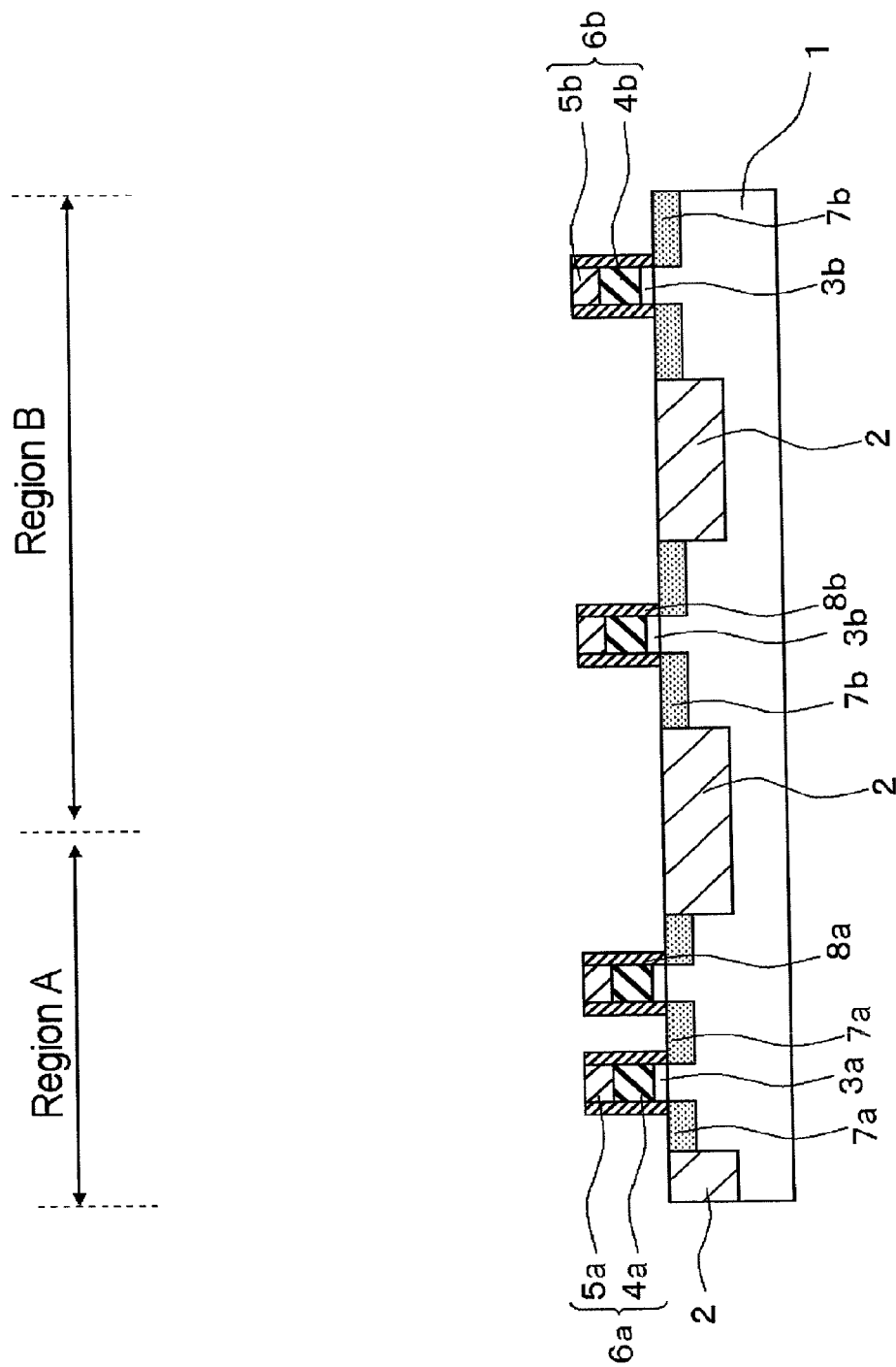
FIGS. 15-19 are cross-sectional views explaining a procedure of forming the memory cell region and the peripheral circuit region in parallel in the semiconductor device of the present invention.
Figure 16:
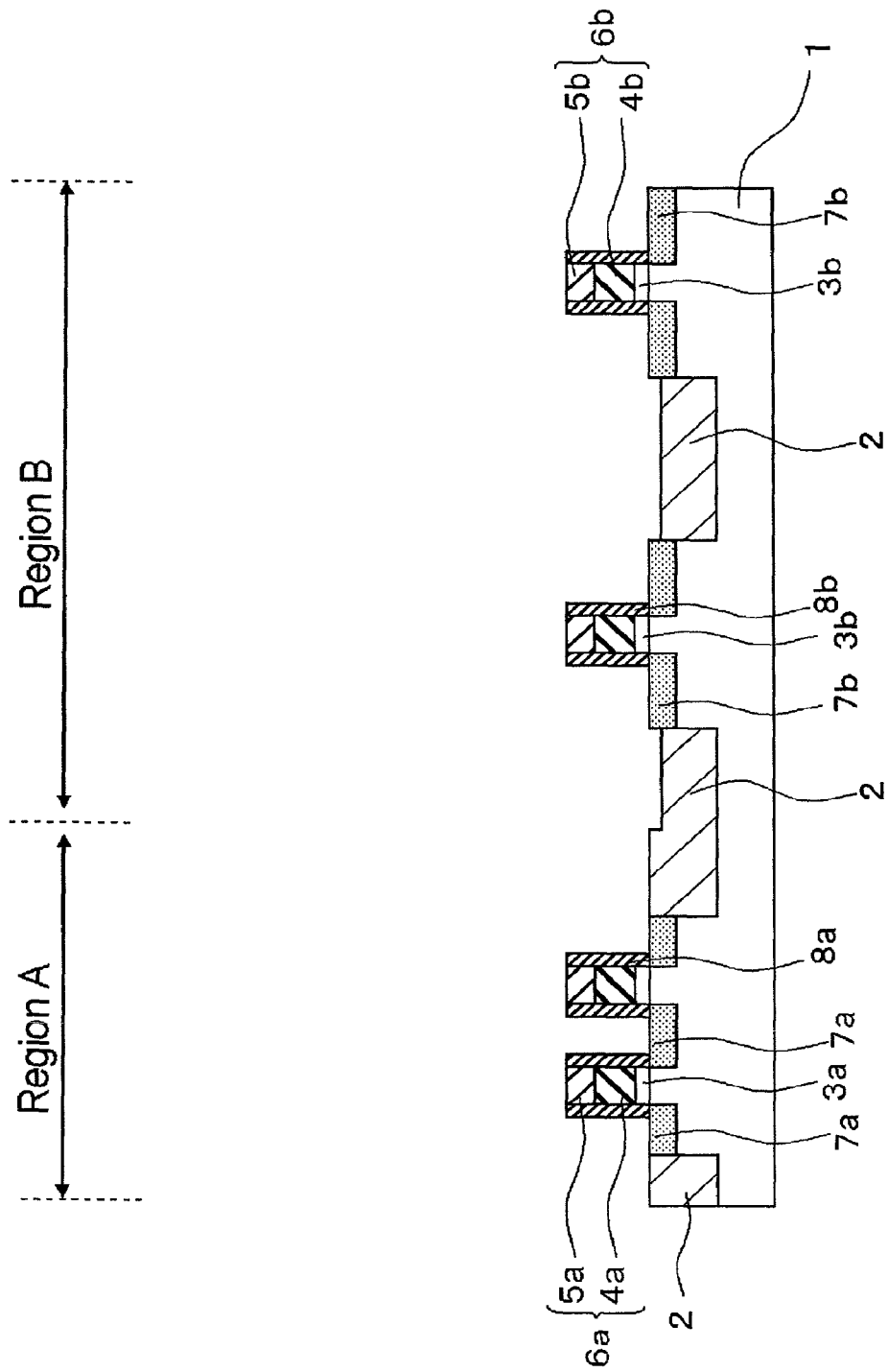
Figure 17:
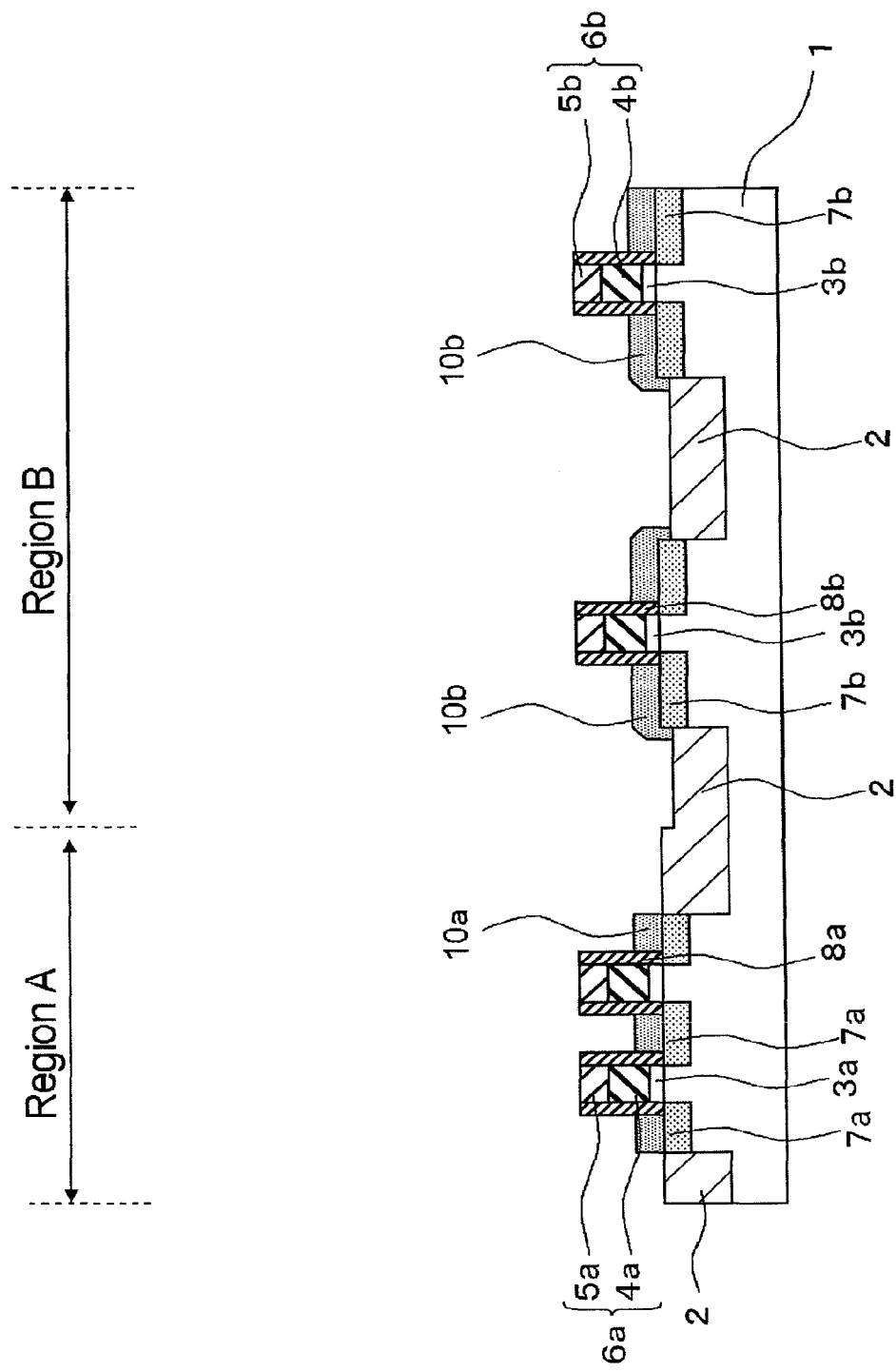
Figure 18:
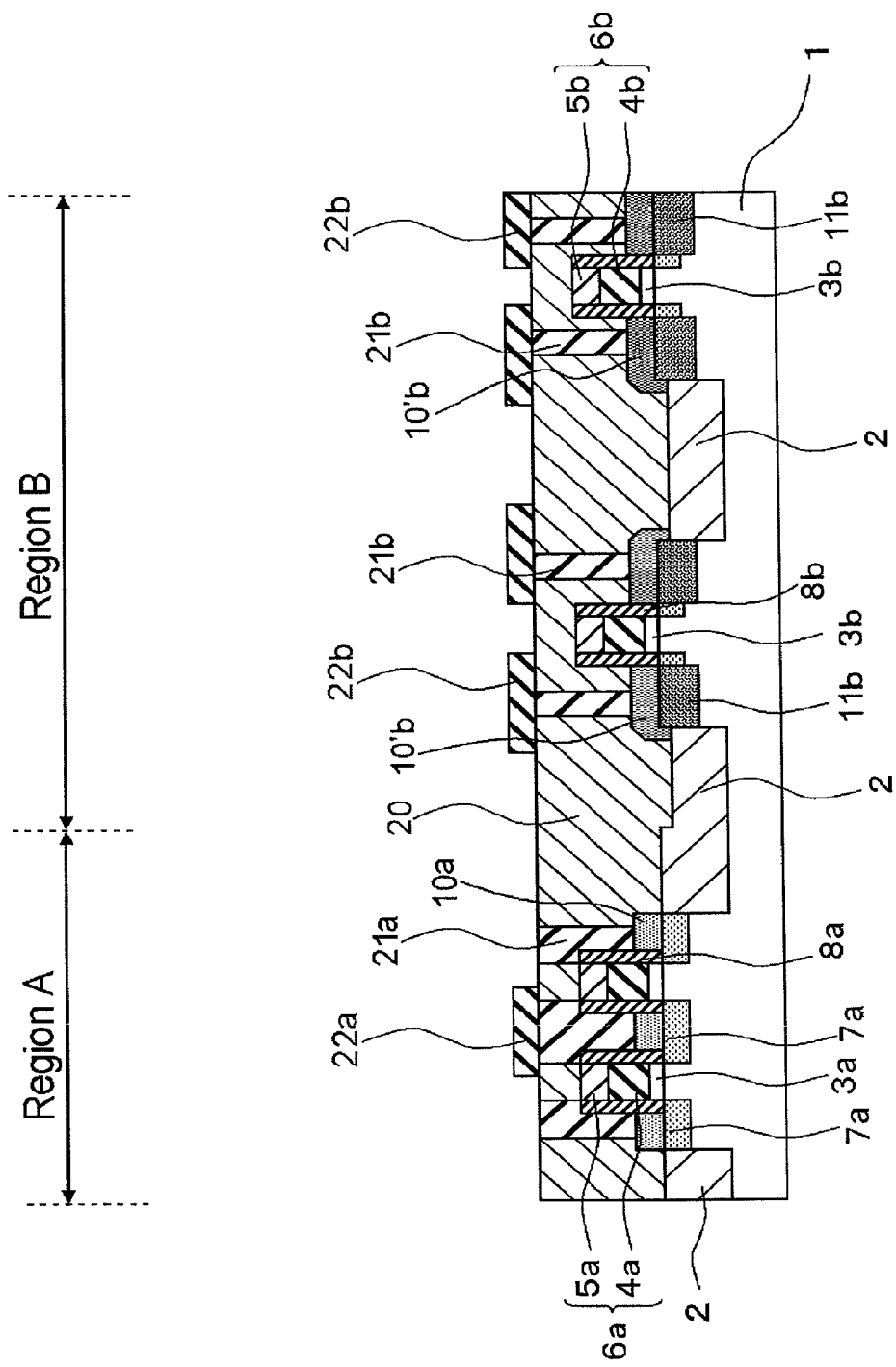

FIG. 14 is a cross-sectional view taken along line B-B' of FIG. 12. Unlike STI 2 in the peripheral circuit region, STI 2 in the memory cell region is formed at substantially the same level as the surface of semiconductor substrate 1 without being etched. Meanwhile, although according to the forming methods of STI 2, the surface level of STI 2 in the memory cell region may often slightly vary up and down from the substrate surface, it is accepted if it is within a few nm. As a result, semiconductor layer 10 in the memory cell region has a facet F in the active area and protrudes on a portion of STI 2 as shown in FIG. 14. Here, the surface of STI 2 can preferably be formed from a silicon oxide layer that restricts the epitaxial growth of semiconductor layer 10. If the surface of the STI is formed from a material such as silicon nitride layer that does not restrict the epitaxial growth of semiconductor layer 10, a facet is not formed, or otherwise is slightly formed, so that the growth proceeds on STI 2 to substantially the same degree as the layer thickness. In the present invention, semiconductor layer 10 in the memory cell region is formed such that it has the facet, thereby also having the effect of restricting the lateral projection.

The width of STI 2 in the memory cell region is much smaller than the width of STI 2 in the peripheral circuit region, so that if semiconductor layers 10 grown on STI 2 come to contact with each other, a short circuit is caused and normal data storage cannot be ensured. Thus, the thickness of semiconductor layer 10 is required to be properly controlled according to the width of STI 2 in the memory cell region such that semiconductor layers 10 are not brought into contact with each other. Here, in the peripheral circuit region, semiconductor layer 10 is also formed such that it has the same thickness. According to the conventional structure, as the thickness of the semiconductor layer is made thinner, a facet is formed inside the active area, so that the width of deep region 11d of high density impurity diffusion layer 11 is also ready to increase. In contrast in the present invention, since semiconductor layer 10 is also grown from the silicon layer exposed from the side of STI 2 drawn back in the peripheral circuit region, even though semiconductor layer 10 is made thinner, facet F can be stably formed outside the active area. As a result, in the process of subsequent formation of the high density impurity diffusion layer, deep junction in the outer portion of the active area can be prevented.

Next, a description will be made of exemplary parallel installation of the memory cell region and the peripheral circuit region using a common process.

FIGS. 15-19 are schematic cross-sectional views showing a procedure of forming the memory cell region (Region A) and the peripheral circuit region (Region B) in parallel. In the figures, a transistor in the memory cell region is described in a simplified form as a single cell unit. In addition, an element in the memory cell region is attached with 'a' after reference numeral, an element in the peripheral circuit region is with 'b' after reference numeral, and in the common process, such affixes are omitted.

(FIG. 15)

Gate electrode 6 (gate conductive layer 4 and cap layer 5) serving as a MOS transistor is formed in the memory cell region and the peripheral circuit region on semiconductor substrate 1 having STI 2 therein, with gate insulating layer 3 interposed therebetween, sidewall spacers 8 are formed on the sides of gate electrode 6, and LDD layer 7 is formed on the surface of semiconductor substrate 1 using sidewall spacers 8 as a mask.

(FIG. 16)

Etching of silicon oxide is performed while masking the memory cell region using a photoresist layer (not shown). Thus, only the surface of STI 2 in the peripheral circuit region is lowered. When focussing attention on the central STI 2, although a portion (a first portion) of STI contacted with LDD layer 7a (a first active area) in Region A is not etched, a portion (a second portion) of STI contacted with LDD layer 7b (a second active area) is etched back so as to form a hollow which exposes a side surface of the second active area.

(FIG. 17)

Semiconductor (silicon) layers 10a and 10b are formed in the thickness of 20 to 40 nm on the exposed semiconductor substrate 1 (LDD layers 7a and 7b) in the memory cell region and the peripheral circuit region by means of selective epitaxial growth.

Since the surface of STI 2 in the memory cell region is not lowered, a silicon layer of semiconductor substrate 1 is not exposed from the side of the source/drain electrode (LDD layer 7a), and lateral growth of semiconductor layer 10a is restricted as compared with the peripheral circuit region.

(FIG. 18)

Impurities are ion-implanted only into the peripheral circuit region to form the high density impurity diffusion layer 11b (source/drain electrode). Here, the implanted impurities are also diffused into the semiconductor layer 10b in the peripheral circuit region, forming elevated source/drain region 10'b.

Meanwhile, since the high density ion-implantation of impurities is not performed on the memory cell region, the memory cell region is masked using e.g. photoresist layer (not shown).

First interlayer insulating film 20 and first contact plugs 21a and 21b are formed. Interconnects 22a and 22b are formed using tungsten. Interconnect 22a in the memory cell region serves as a bit line. Interconnect 22b in the peripheral circuit region serves as an electrode lead line of the peripheral circuit transistor. In addition, although not shown, a contact plug and interconnect are similarly formed such that they are connected to the gate electrode.

When forming first contact plug 21a in the memory cell region, the impurities having the same conductive type of LDD layer 7a can be introduced into semiconductor layer 10a through the contact hole in the memory cell region. Thus, the contact resistance of first contact plug 21a can be reduced.

(FIG. 19)

Second interlayer insulating film 24 and second contact plug 25a are formed. Capacitor 26 as a memory device is formed such that it is connected to second contact plug 25a.

Third interlayer insulating film 27 and third contact plugs 28a and 28b are formed, and second interconnects 29a and 29b are formed using aluminum (Al), copper (Cu), etc.

Figure 19:
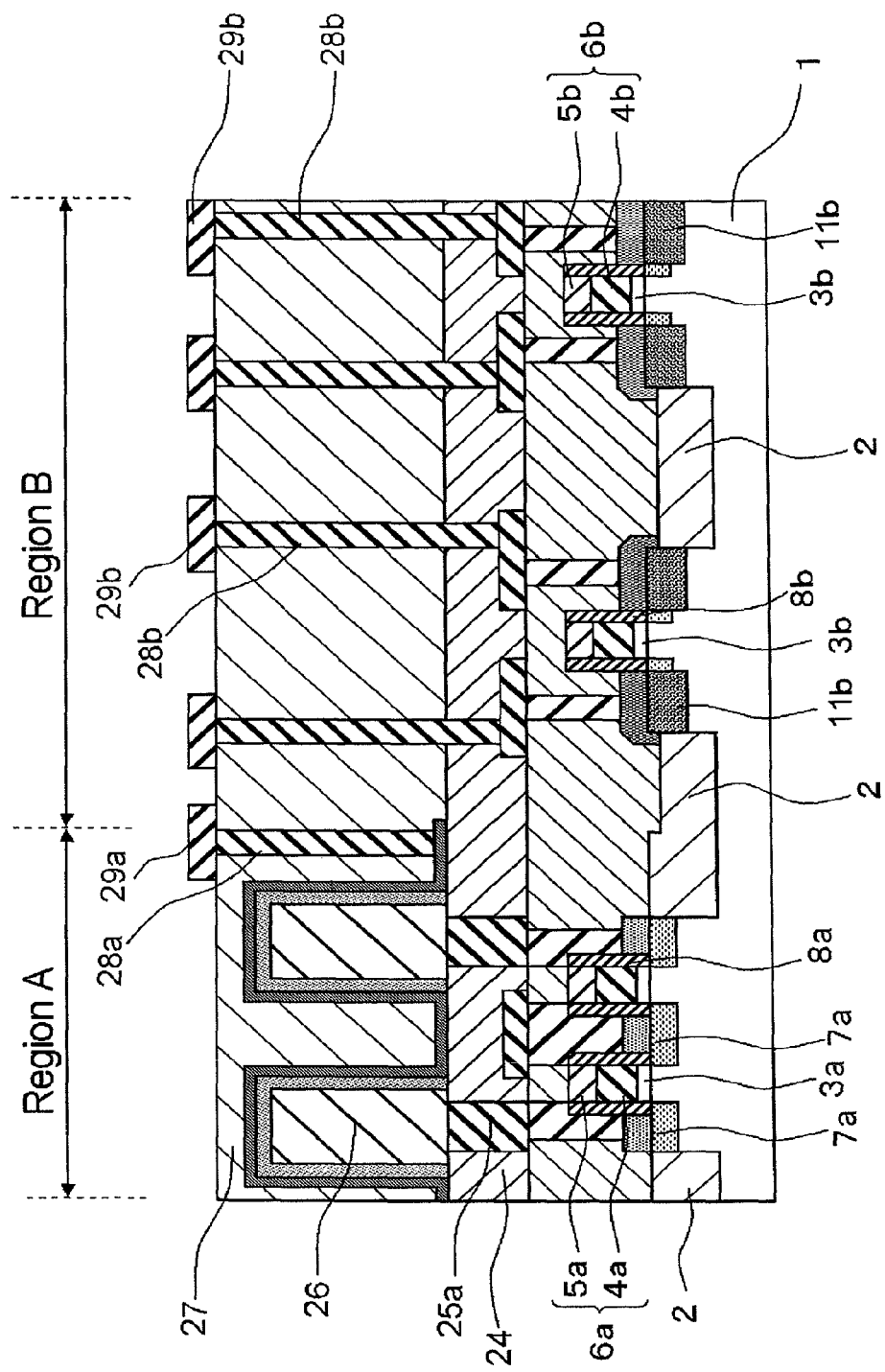

Form the above-mentioned process, a DRAM device having the memory cell region and the peripheral circuit region as shown in FIG. 19 is formed.

The present invention is not limited to the above-mentioned embodiments, but can properly adapt known technology without departing from the spirit of the present invention. For example, a formation of a metal silicide layer such as cobalt silicide on semiconductor layer 10 for reducing the contact resistance is effective to the transistor in the peripheral circuit region which is required to operate at high speed. Similarly, the first contact plug connected to semiconductor layer 10 can be availably formed with metal such as tungsten optionally with a metal barrier.

In further another aspect of the present invention, the following methods of manufacturing a semiconductor device are provided:

I. A method of manufacturing a semiconductor device including a memory cell region having a memory device and a cell transistor electrically connected to the memory device, a peripheral circuit region in which a peripheral circuit transistor is formed, the method including:

forming a shallow trench isolation (STI) in a first conductive type semiconductor substrate to zone active areas for the cell transistor and the peripheral circuit transistor;

forming gate electrodes in the cell transistor and the peripheral circuit transistor, respectively;

forming sidewall spacers on both sides of the respective gate electrode;

doping second conductive type impurities with low density into active areas on both sides of the respective gate electrode;

selectively drawing only the STI in the peripheral circuit region backwards from the surface of the semiconductor substrate;

forming semiconductor layers on the substrate surface in which the memory cell region and the peripheral circuit region are exposed by a selective epitaxial growth; and doping second conductive type impurities into the active area in the peripheral circuit region through the respective semiconductor layer, wherein the semiconductor layers are formed into a thickness that prevents the semiconductor layers of adjacent cell transistors in the memory cell region from coming into contact with each other, and wherein the step of drawing the STI in the peripheral circuit region backwards from the surface of the semiconductor substrate is performed until sufficient drawn-back is obtained such that a portion where facet formation occurs at the end of semiconductor layer in the peripheral circuit region is positioned outside the active area for the peripheral circuit transistor by the semiconductor layer epitaxially grown also from the side of the semiconductor substrate exposed when the surface of the STI is drawn back.

II. The method as set forth in item I, wherein the step of drawing the STI in the peripheral circuit region backwards from the surface of the semiconductor substrate is performed until the amount of drawn-back of 10 nm or more is obtained.

III. The method as set forth in item I, wherein the semiconductor substrate is a silicon substrate and the epitaxially growth semiconductor layer is a silicon layer.

IV. The method as set forth in item I, wherein the STI is formed by embedding silicon oxide.

V. The method as set forth in item I, wherein the sidewall spacer is formed from a silicon nitride layer.

What is claimed is:

1. A semiconductor device comprising:

a memory cell region having a memory device and a cell transistor electrically connected to the memory device, and a peripheral circuit region in which a peripheral circuit transistor is formed;

wherein the cell transistor comprises, in a first active area of a semiconductor substrate zoned by a shadow trench isolation:

a first gate electrode;

first source/drain regions formed on both sides of the first gate electrode; and
a first selectively epitaxially grown semiconductor layer formed on the first source/drain regions,
wherein the peripheral circuit transistor comprises, in a second active area of the semiconductor substrate zoned by a shallow trench isolation:
a second gate electrode;
second source/drain regions of an LDD structure including a high density impurity diffusion layer formed on both sides of the second gate electrode; and
elevated source/drain regions formed from a second selectively epitaxially grown semiconductor layer formed on the second source/drain regions;
wherein the first and second selectively epitaxially grown semiconductor layers of the cell transistor and the peripheral circuit transistor, respectively, have a substantially similar thickness such that the semiconductor layers provided on first active areas of adjacent cell transistors opposite to each other do not contact each other;
wherein a surface of the shallow trench isolation in the peripheral circuit, region is drawn back From a surface of the semiconductor substrate, and
wherein a surface of the shallow trench isolation in the memory cell region is not drawn back from a surface of the semiconductor substrate.

2. A semiconductor device comprising;
a cell transistor provided in a memory cell region,
a peripheral circuit transistor provided in a peripheral circuit region, and
a shallow trench isolation defining each active area of the cell transistor and the peripheral circuit transistor in a semiconductor substrate;
wherein the cell transistor comprises a first impurity diffusion layer, a first gate electrode and a first gate sidewall spacer;
wherein the peripheral circuit transistor comprises a first impurity diffusion layer, a second impurity diffusion layer, a second gate electrode and a second gate sidewall spacer;
wherein the second impurity diffusion layer is higher in impurity density than the first impurity diffusion layer of the peripheral circuit transistor;
wherein a selectively epitaxially grown semiconductor layer is provided on the first impurity diffusion layer of the cell transistor and the second impurity diffusion layer of the peripheral circuit transistor;
wherein the shallow trench isolation defining the active area of the cell transistor is not drawn back from a surface of the semiconductor substrate so that a first side surface of the semiconductor substrate is not exposed;
wherein the shallow trench isolation defining the active area of the peripheral circuit transistor is drawn back from a surface of the semiconductor substrate so that a second side surface of the semiconductor substrate is exposed; and
wherein the cell transistor further comprises a first contact plug electrically connected between the selectively epitaxially grown semiconductor layer and a bit line.

* * * * *